US007237153B2

(12) United States Patent
Di Ronza et al.

(10) Patent No.: US 7,237,153 B2
(45) Date of Patent: Jun. 26, 2007

(54) INTEGRATED MEMORY AND METHOD FOR TESTING AN INTEGRATED MEMORY

(75) Inventors: Mario Di Ronza, München (DE); Yannick Martelloni, Poing (DE); Volker Schöber, Hannover (DE)

(73) Assignee: Infineon Technologies AG, Munich (DE)

( * ) Notice: Subject to any disclaimer, the term of this patent is extended or adjusted under 35 U.S.C. 154(b) by 461 days.

(21) Appl. No.: 10/726,990

(22) Filed: Dec. 3, 2003

(65) Prior Publication Data

US 2004/0153925 A1  Aug. 5, 2004

(30) Foreign Application Priority Data

Dec. 3, 2002  (DE) ................. 102 56 487

(51) Int. Cl.
*G11C 29/00* (2006.01)
*G11C 7/00* (2006.01)

(52) U.S. Cl. .................. 714/701; 714/719; 365/201

(58) Field of Classification Search ............ 714/710, 714/711, 718, 719, 723; 365/200, 201
See application file for complete search history.

(56) References Cited

U.S. PATENT DOCUMENTS

| 5,506,807 | A | * | 4/1996 | Ferrant et al. ............ 365/200 |
| 5,588,115 | A | | 12/1996 | Augarten |
| 6,469,932 | B2 | * | 10/2002 | Roohparvar et al. ... 365/185.09 |
| 6,560,149 | B2 | * | 5/2003 | Muller ................. 365/200 |
| 6,590,816 | B2 | * | 7/2003 | Perner ................. 365/200 |
| 6,731,550 | B2 | * | 5/2004 | McClure ............... 365/200 |
| 2002/0157049 | A1 | * | 10/2002 | Kaiser et al. ............ 714/723 |

FOREIGN PATENT DOCUMENTS

| DE | 39 24 695 | A1 | | 2/1990 |
| DE | 100 02 127 | A1 | | 8/2001 |
| DE | 101 09 335 | C2 | | 9/2002 |
| DE | 101 10 469 | A1 | | 9/2002 |
| DE | 101 19 144 | C1 | | 10/2002 |
| EP | 0702373 | A1 | * | 3/1996 |

OTHER PUBLICATIONS

"Increased Throughput for the Testing and Repair of RAM's with Redundancy", Ramsey W. Haddad, Anton T. Dahbura and Anup B. Sharma, EIII Transactions on Computers, vol. 40, No. 2, Feb. 1991, pp. 154-166.

* cited by examiner

*Primary Examiner*—Cynthia Britt
(74) *Attorney, Agent, or Firm*—Eschweiler & Associates, LLC

(57) ABSTRACT

An integrated memory and method for testing an integrated memory is provided herein. In order to test an integrated memory having a main data memory with a plurality of data memory units, a data memory unit is addressed and input test data for testing the addressed data memory unit are applied to the main data memory. The output test data are read out from the main data memory and compared with expected desired output test data in a self-test unit. Deviations detected during the comparison are buffer-stored in a redundancy analysis memory. These information items buffer-stored in the redundancy analysis memory are read out and transferred to a computing unit. In the computing unit, the defect positions in the output test data are identified, and a repair strategy is determined by means of redundant rows and/or redundant columns and/or redundant words provided. The redundant words required for the repair strategy are written to the redundancy analysis memory and activated.

22 Claims, 2 Drawing Sheets

INTEGRATED MEMORY AND METHOD FOR TESTING AN INTEGRATED MEMORY

REFERENCE TO RELATED APPLICATIONS

This application claims the benefit of the priority date of German application DE 102 56 487.6, filed on Dec. 3, 2002, the contents of which are herein incorporated by reference in their entirety.

TECHNICAL FIELD OF THE INVENTION

The invention relates to an integrated memory with a plurality of memory cells arranged in matrix form in a memory cell array, and to a method for testing an integrated memory of this type.

BACKGROUND OF THE INVENTION

The greatly increasing demand for memory space from application programs has led in the past to a rapid increase in the memory size of semiconductor memories. With an increasing memory size and the accompanying increased integration level in the fabrication of semiconductor memories, there is also an increase in the probability of memory cells of the data memory or semiconductor memory being fabricated defectively in the manufacturing process and thereby being non-functional. In order to avoid a high proportion of rejects in semiconductor memories, the semiconductor memories are fabricated with redundant memory areas. For this purpose, in the case of a semiconductor memory constructed from rows and columns, additional redundant rows and redundant columns are arranged on the memory chip.

Integrated circuits, in particular integrated semiconductor memories, are subjected to a test method after fabrication in order to test the logical and dynamic behaviour of the circuit and at the same time on the one hand to detect defective circuits and on the other hand to check the performance of the circuit by evaluating the test results. In known test methods, an automatic test machine is used to generate test patterns that are applied to the integrated circuit. At the outputs of the integrated circuit, the response patterns are read out by the automatic test machine and compared with desired response patterns. The integrated circuit is defect-free when the output response patterns correspond to the desired response patterns. The integrated semiconductor memories are often constructed with BIST structures (Built-In Self-Test). These BIST structures have built-in self-test units. This means that additional logic circuitry that has test pattern generators and evaluation units for the test patterns is integrated in the integrated semiconductor memory. In embodiments of this type, the automatic test machine supplies only one clock signal for the circuit to be tested and, on the basis of the data read out by the evaluation units for the test patterns, determines whether a defective or defect-free semiconductor memory is present. Integrated circuits with self-test units generally have memory units or memory registers that afford the possibility of generating test patterns (for example BILBO registers (Built-In Logic Block Observation), which generally have four operating states). Counters are generally employed in order to test all the addresses in a defined order. Furthermore, a small number of test patterns are defined, which test patterns are generally stored. The abovementioned explanations relate to a logic test.

A redundancy control logic integrated in the semiconductor memory controls the access to the redundancy address memory and to the redundancy data memory. The redundancy address memory has address memories in which the faulty addresses of the defective memory cells of the memory cell array of the main data memory are stored. Since the faulty addresses stored in the address memories are lost in the event of failure of the power supply, these faulty addresses detected during the testing of the semiconductor memory are additionally permanently programmed into a read-only memory. These addresses programmed into the read-only memory can be written to the redundancy address memory again from the read-only memory, as required.

If a defective memory cell or data memory unit in the memory cell array of the main data memory is identified in a test run, the error address of the defective memory cell is written to an address memory unit or an address memory register of the redundancy address memory. In the case of an access to this error address, the assigned memory cell within the redundancy data memory is accessed rather than the defective memory cell within the main data memory. On account of this readdressing, it is possible to a certain degree (depending on the number of defective memory cells and the size of the redundancy data memory) to replace defective memory cells within the main data memory by redundant memory cells in the memory cell array of the redundancy data memory.

Various embodiments of test methods are known. DE 39 24 695 A1 discloses an internal self-test and redundancy programming method for memory circuits. When an operating voltage is switched on by an internal self-test processor with a microprocessor, the memory circuit is tested and the error addresses are determined. The error addresses determined are compressed and stored in a register bank of the self-test processor. From the distribution of the error addresses, the redundancy structure is determined and the corresponding redundancy bit lines and redundancy word lines are activated. Thus, in this method, firstly the entire number of error addresses of the entire memory is determined and only afterward does the calculation of the redundancy strategy begin. This means that a very large volume of data has to be stored since, by means of error-detecting codes, the positions of the defective memory cells are determined and a complete bitmap of all the defective bits is created and stored. One disadvantage of such test methods and circuit arrangements is that this two-stage nature of the test procedure means that a great deal of time is required for testing and repairing and a highly cost-intensive method also results from this. Furthermore, very large memory units are required for the volume of data of the very large bitmaps. A further disadvantage results from the fact that only entire word and/or bit lines can be replaced by means of this method. By way of example, if only one memory cell is defective in a row with 256 memory cells, then the complete row is replaced and 255 defect-free memory cells are wasted. This results in a considerable waste of space in the available area of the semiconductor memory, which has to be made appropriately large in the case of test and repair methods of this type.

Furthermore, the published German Patent Application DE 101 10 469 A1 discloses a test and repair method and also an integrated memory. The method can be used to repair integrated memories that have already left the test phase with the manufacturer and are in use in current operation. If a defective row or column is identified by a self-test unit in current operation, the self-test unit generates an error signal for this row or column and generates a repair signal depending on a comparison of the error signal with an average error signal. As a result of the triggering of the repair signal, a self-repair unit, in current operation, replaces the defective row or column by a redundant row or redundant column. The test method also enables single-cell defects to be detected and repaired by means of an entire row or an entire column. One disadvantage is that, by virtue of the error-detecting and error-correcting codes, in addition to the redundant rows and redundant columns, further memory cells are lost as useful information and, moreover, a repair is possible only by means of redundant rows and/or redundant columns. Consequently, here, too, a very high number of defect-free memory cells are wasted and an ineffective and inefficient repair strategy is taken as a basis.

Furthermore, the published German Patent Application DE 100 02 127 A1 discloses a test method and a data memory in which, during the test procedure, an address of a memory cell of a main data memory that has been identified as defective is immediately readdressed to an assigned redundancy memory unit within a redundancy data memory. The error detection and the readdressing of each individual address are therefore effective directly successively during the test run rather than only after all the faulty addresses have been detected. One disadvantage of this method and this arrangement is that, on account of the limited size of the redundancy memory unit, only a relatively small number of defective memory units can be replaced by redundant memory units. Therefore the result is that there are many rejects of main memories or data memories that cannot be completely repaired, or, on the other hand, the redundancy data memory has to be very large in order to be able to repair a highest possible number of defective memory cells by redundant memory cells.

The known method is not based on a specific test strategy in order to optimize the identification of the defects or to be able to detect specific categories of defects more simply. The column-oriented defect, in particular, is a major problem in the case of this method. A further disadvantage here is that the defective data memory units are immediately repaired individually, as a result of which an effective repair in comparison with methods in which firstly a plurality of defects are detected and only then is a repair strategy determined is generally possible only to a very limited extent. Furthermore, no redundant rows and/or redundant columns are made available for the repair.

SUMMARY OF THE INVENTION

It is an object of the invention to provide a method for testing integrated memories and an integrated memory of this type in which all defective memory cells can be identified rapidly and reliably and the probability of having to separate out a defective integrated memory as a reject can be reduced. Furthermore, it is an object to be able to provide the data of the defective memory units with a reduced outlay.

In a method according to one example of the invention for testing an integrated memory having a main data memory with a plurality of data memory units, the following steps are carried out:

a) addressing a data memory unit by the address of the data memory unit being applied to an address bus connected to the main data memory;

b) application of input test data to a data bus connected to the main data memory for the purpose of testing the addressed data memory unit;

c) read-out of output test data from the main data memory, in particular from the addressed data memory unit;

d) comparison of the output test data with expected desired output test data;

e) buffer-storage of the applied address, of the expected desired output test data and of the output test data in a redundancy analysis memory if a deviation of the output test data from the desired output test data occurs;

f) provision of first redundant areas of the integrated memory in the redundancy analysis memory and provision of at least second redundant areas of the integrated memory outside the redundancy analysis memory; and g) determination of a repair strategy by means of the redundant areas on the basis of the information items buffer-stored in the redundancy analysis memory.

The method according to the invention makes it possible, on the one hand, to detect defective memory cells rapidly and reliably and, on the other hand, to reduce the probability of having to separate out a defective integrated memory as a reject. Furthermore, the redundancy analysis memory can be utilized in a dual function in that, in the first place, diagnosed data or items of information about defective data memory units are stored therein and, furthermore, a repair strategy can be determined on the basis of the information items contained in the redundancy analysis memory. Based on the repair strategy, first redundant areas are provided in the redundancy analysis memory and second redundant areas are provided outside the redundancy analysis memory.

In the case of the method according to the invention, it is no longer necessary firstly to extend all defective data memory units of an entire main data memory by means of an error-detecting or an error-correcting code or to store them in a generally very large bitmap in order only afterwards to be able to develop a repair strategy. The method according to the invention makes it possible to provide the data of the defective memory units and also the processing thereof and the associated determination of an optimum, effective and efficient repair strategy with a reduced outlay. The repair of an integrated memory can be carried out in an extremely variable and alterable manner by means of the method according to the invention, and be adapted to the number and/or the position of the defective data memory units detected. As a result, it is thus possible to prevent the wasting of a large number of functional data memory units, this wasting being inevitable in the case of the known test methods, which are generally less detailed and more coarsely structured.

In a preferred exemplary embodiment, the main data memory is subdivided, for testing purposes, into a plurality of sub-areas, and each individual sub-area can be arbitrarily selected and tested separately. It is advantageous if the sub-areas are of identical size. However, provision may also preferably be made for designing the said sub-areas with a different size. A dedicated repair strategy is determined for each sub-area. The testing of the individual sub-areas of the main data memory is advantageously carried out in an iterative manner, the sub-areas being tested successively. The entire main data memory can thus be repaired piecemeal. As a result, an entire test procedure can be carried out more rapidly. By way of example, if one sub-area already has so many defects that repair using the existing redundancies is no longer possible, it can already be identified here that the entire main data memory is no longer repairable and further sub-areas no longer have to be tested. Furthermore, the determination of repair strategies for smaller local areas of the main data memory is less complicated and simpler to design.

It may advantageously be provided that at least one first sub-area of the main data memory is provided as a redundant area. Preferably, the first sub-area is tested first of all. After the conclusion of the testing of the first sub-area, useful information items of a sub-area to be tested as a further sub-area are transferred to the first sub-area. What can thereby be achieved is that one sub-area of the entire main data memory is always being tested, in particular if the circuit does not have an operating requirement. If the first sub-area has been tested, the useful information from the next sub-area of the main data memory that is to be tested is copied or transferred to the first sub-area and this further sub-area can be tested. As a result, a repair can be carried out permanently and continuously if an error has occurred (Online Test). This is ensured by a sub-area of the main data memory itself being provided as a redundant area. The redundancy thus extends over a plurality of rows and/or a plurality of columns that can be provided in the first sub-area as redundant areas. As a result, it may also be provided that the redundancy method or the test method identifies which sub-areas can no longer be repaired and which associated addresses can be masked out. The selection of the sub-areas can generally be effected with a small number of bits, in particular with the so-called more significant bits. By way of example, if there are 4 sub-areas into which the main memory is subdivided, then 2 bits are required in order to be able to unambiguously identify these 4 sub-areas. If these bits are reprogrammed by means of a suitable logic, for example by means of XOR elements, then it would be possible virtually to carry out an exchange of the sub-areas of the main data memory, and possibly to effect a replacement by redundant sub-areas. This affords the possibility of carrying out continuous testing and checking, and possibly reporting if repair is no longer possible or defects that are not allowed occur. This is a particular advantage particularly for safety-relevant applications.

Preferably, the first redundant areas of the redundancy analysis memory are provided and used for repairing each individual sub-area. The second redundant areas are preferably provided only for one sub-area in each case. The first redundant areas can thus be assigned to any desired sub-area in a flexible and variable manner.

It is preferred if the first redundant areas, depending on the number of detected deviations of the output test data from the expected desired output test data, are taken into account before the further available redundant areas of the integrated memory for the determination of the repair strategy. It is thereby possible to precisely define in a targeted manner the number of defective data memory units detected in the case of which a repair attempt is initially more promising with the first redundant areas than with other redundant areas. The probability of being able to provide an integrated memory, in particular a sub-area of the main data memory, in defect-free fashion successfully, with little outlay and relatively simply can thereby be significantly increased.

It proves to be particularly advantageous if exclusively first redundant areas of the redundancy analysis memory are taken into account or used for the repair strategy if a test run is ended and the storage capacity of the redundancy analysis memory is occupied at most maximally with the information items of the defective data memory units detected. In this case, a repair strategy can be determined in a particularly simple manner. Only the first redundant areas are accessed in order to determine a repair strategy. The corresponding information items have already been written to the first redundant areas in this case, so that the outlay is minimized for the design of the repair strategy.

If the storage capacity of the redundancy analysis memory is exceeded by the number of defective data memory units detected, which are stored in the redundancy analysis memory, and if the first test run is not yet concluded, then steps explained below are advantageously carried out in order to determine the repair strategy in accordance with step g). Firstly, the information items buffer-stored in the redundancy analysis memory are read out and transferred to a computing unit. An intermediate repair strategy is subsequently determined by means of the second redundant areas and/or third redundant areas possibly present. These third redundant areas possibly present are likewise arranged outside the redundancy analysis memory. Afterwards, the test run is continued if the first test run is interrupted before the read-out of the information items from the redundancy analysis memory. In a further step, steps a) to g) are repeated.

In a preferred exemplary embodiment, the information items are read out from the redundancy analysis memory into the computing unit only when the number of detected deviations between the output test data and the desired output test data exceeds the storage capacity of the redundancy analysis memory or a first test run is ended.

In an advantageous manner, steps a) to g) are repeated until an integrated memory that is no longer repairable is identified during or after the carrying out of one of steps a) to g), and also the previously described steps of reading out the information items, determining an intermediate repair strategy and continuing the test run, or a test run is ended and the storage capacity of the redundancy analysis memory after the ending of the test run is occupied at most maximally with information items of further defective data memory units detected.

Preferably, after the ending of the test run, a final or concluding repair strategy is determined by means of one or more previously determined intermediate repair strategies and first redundant areas and/or second redundant areas possibly still present and/or at least third redundant areas possibly still present. By including all previously determined repair possibilities and redundancies still present, it is possible to optimize the repair of the integrated memory and enable a highest possible probability for complete repair in conjunction with a minimized outlay. Furthermore, it is thus possible to prevent many functional data memory units from being occupied or wasted.

In a particularly preferred manner, it is possible that the previously determined intermediate repair strategies can be altered during the determination of a second or further intermediate repair strategy. It is equally possible for the previously determined intermediate repair strategies to be modified or even entirely replaced during the determination of a concluding repair strategy. This is a particular advantage since, consequently, until the conclusion of the test run, a chosen intermediate repair strategy or generally all previously generated repair possibilities can be adapted to an altered structure or distribution of defective data memory units in the memory cell array. As a result, a high flexibility of the test method can be made possible until the end of the test run, and particularly efficient repair alternatives can be created from this. This in turn results in a high probability of being able to repair the memory without occupying a large number of functional data memory units in the process.

It may be provided that the information items buffer-stored in the redundancy analysis memory are read out progressively. However, it may also be provided that the information items buffer-stored in the redundancy analysis memory are read out completely and only then is the determination of a repair strategy begun in the computing unit. In an advantageous manner, information items read out from the redundancy analysis memory can be written to the redundancy analysis memory again during the determination of an intermediate repair strategy or a concluding repair strategy. The information items are thus transferred back again. This is advantageous inter alia when the first information items read out characterize defective data memory units that are distributed on the memory cell array in such a way that only a relatively ineffective intermediate repair strategy or concluding repair strategy could be determined, and repair could only be achieved with a considerable waste of intact data memory units. By carrying out a process of shifting back into the redundancy analysis memory, and thus deferring a possible repair of this or these defective data memory units, it is possible to increase the quality of the repair strategy.

In an advantageous manner, before the determination of an intermediate repair strategy, the exact defect positions are determined in the output test data by a bit-by-bit comparison between the expected desired output test data and the output test data being carried out in the computing unit. This results in a precise position of the defective bits or of the defective memory cells in the memory cell array of the main data memory and the selection of which redundant areas appear preferably to be suitable for a repair strategy can be significantly improved.

It is advantageous for those information items which identify which first redundant areas and/or which second redundant areas and/or which third redundant areas possibly present are taken into account for an intermediate repair strategy or a concluding repair strategy to be written to memory registers connected to the computing unit.

In an advantageous manner, the first test run is interrupted during the read-out of the information items from the redundancy analysis memory and the determination of an intermediate repair strategy. It may be provided that after the continuation of the first test run, a test algorithm for testing is chosen which is different from the test algorithm with which testing is carried out before the interruption of the first test run. However, it may also be provided that the test run is continued with the same test algorithm that was used before the interruption. It may also be provided that after the conclusion of the first test run, one or more further test runs are carried out, different test algorithms being used in each further test run. This makes it possible to ensure a flexible test sequence in which a plurality of test algorithms can be made available and selected for a further test run. As a result, it is possible to increase the probability of detecting defective data memory units. In a particularly advantageous manner, it is thus possible to detect bit-oriented or word-oriented defects by using specific test algorithms that permit defects categorized in this way to be able to be detected with high probability. The effectiveness of the method according to the invention can thus be increased.

Preferably, the first test run is carried out with the maximum clock frequency of the integrated memory. What can thereby be achieved is that the integrated memory is tested virtually under conditions that exist in the later use of the integrated memory. Furthermore, the probability of detecting defective data memory units can thereby be increased.

Furthermore, it is advantageous that during the read-out of the information items stored in the redundancy analysis memory, that clock frequency with which the integrated memory is tested is reduced and is increased again only if step g) is concluded and the test is possibly continued. It may generally be stated that it is possible to adapt the clock frequency and thus the test speed in all the modules. A low clock frequency is suitable for communicating with external test logic or further modules that operate more slowly. The memory test can also be set individually. What can thereby be achieved is that the test severity can be significantly improved and increased.

In a particularly advantageous manner, the data width of a first redundant area comprises an interval which can extend from a single bit up to a number of bits forming an entire word, and the data widths of the second and possibly of the third redundant area in each case comprise an interval which extends from a single bit up to a number of bits forming an entire row or a plurality of rows, or an entire column or a plurality of columns. As a result, it is possible to ensure that a repair strategy can be carried out with the least possible loss of functional data memory units. Moreover, a further advantage is afforded by virtue of the fact that each redundant area can be subdivided and can thus be designed with variable and different data widths in a diverse manner and can be adapted to the distribution of the defective data memory units in the required repair strategy. By way of example, if a second redundant area is embodied as a redundant row, then this row can be used completely for a repair strategy. However, it is also possible for the redundant row to be halved, the first half being used for eliminating a first defective area of data memory units as efficiently as possible, and the second half being used for eliminating further areas of defective data memory units as efficiently as possible for a repair strategy.

Furthermore, provision may also be made, for example, for again subdividing one of the two halves of the halved row. This can be carried out until a single bit is present as redundant unit for repair. This can be carried out in an analogous manner for the third redundant areas, which are embodied for example as redundant columns. This can also be provided in the same way for the first redundant areas of the redundancy analysis memory. This results in a very high diversity of different data widths of the various redundant areas, thus making it possible to achieve an enormously high number of possible combinations of different redundant areas which may each inherently still have a multiplicity of different data widths. This makes it possible to generate an optimum intermediate repair strategy or concluding repair strategy. In addition to the abovementioned area advantages, it is also possible to achieve speed advantages for the circuit.

Preferably, after the repair of the integrated memory, the information items of the activated first redundant areas and/or second redundant areas and/or third redundant areas possibly present are programmed into a non-volatile memory.

It is particularly advantageous that defects in first redundant areas and/or second redundant areas and/or defects in third redundant areas which are used for an intermediate repair strategy are identified and are replaced by other first redundant areas and/or other second redundant areas and/or other third redundant areas and/or first redundant areas. What can thereby be made possible is that the second and/or third redundant areas which are required and selected for an intermediate repair strategy or a concluding repair strategy and in the case of which, upon the continuation of a test run or in the event of a newly started test run, it is identified that they themselves have defective data memory units can also be repaired as long as redundant areas are available in the integrated memory.

Provision may be made for combining the method according to the invention with known test methods that use error-detecting codes and error-correcting codes.

An integrated memory according to the invention has a plurality of memory cells arranged in a memory cell array. Furthermore, the integrated memory comprises a plurality of row lines and column lines, the plurality of row lines having regular and redundant row lines and the plurality of column lines having regular and redundant column lines. Furthermore, the integrated memory comprises a self-test unit, a redundancy analysis memory with first redundant areas, a computing unit, and second redundant areas, the second redundant areas being arranged outside the redundancy analysis memory. In the event of an access to a row line, the self-test unit checks the contents of the selected data memory units for the correctness thereof. The redundancy analysis memory is connected to the self-test unit and stores the information items from non-correct data memory units. The computing unit is connected to the self-test unit and the redundancy analysis memory, said computing unit determining a repair strategy on the basis of the information items stored in the redundancy analysis memory and possibly initiating an activation of redundant words in the redundancy analysis memory. What can be achieved by means of the integrated memory according to the invention is that defective data memory units are identified rapidly and reliably and it is possible to design a very effective and efficient repair strategy. The redundancy analysis memory can thus be utilized in dual form in that, in the first place, it serves as a memory unit in which the information items of data memory units identified to be non-correct are stored, and it serves as a second, as it were as a redundancy data memory in which possibly first redundant areas which are selected and activated for the repair of the integrated memory are stored.

The integrated memory advantageously has an algorithm unit for selecting test algorithms, which is electrically connected to the self-test unit and the computing unit.

The method for testing integrated memories according to the invention and the integrated memory according to the invention enable detection of defective data memory units without error-detecting or error-correcting codes. It is no longer necessary firstly to detect all defective data memory units and to create an entire bitmap of the defective data memory units in order to determine a repair strategy on the basis of this generally very large and storage-capacity-intensive bitmap. The testing is advantageously facilitated by virtue of the fact that only sub-areas of the entire main memory are tested iteratively and it is attempted firstly to be able to completely eliminate these defects of these sub-areas.

BRIEF DESCRIPTION OF THE DRAWINGS

The invention is explained in more detail below with reference to schematic drawings, in which.

DETAILED DESCRIPTION OF THE INVENTION

Figure 1:
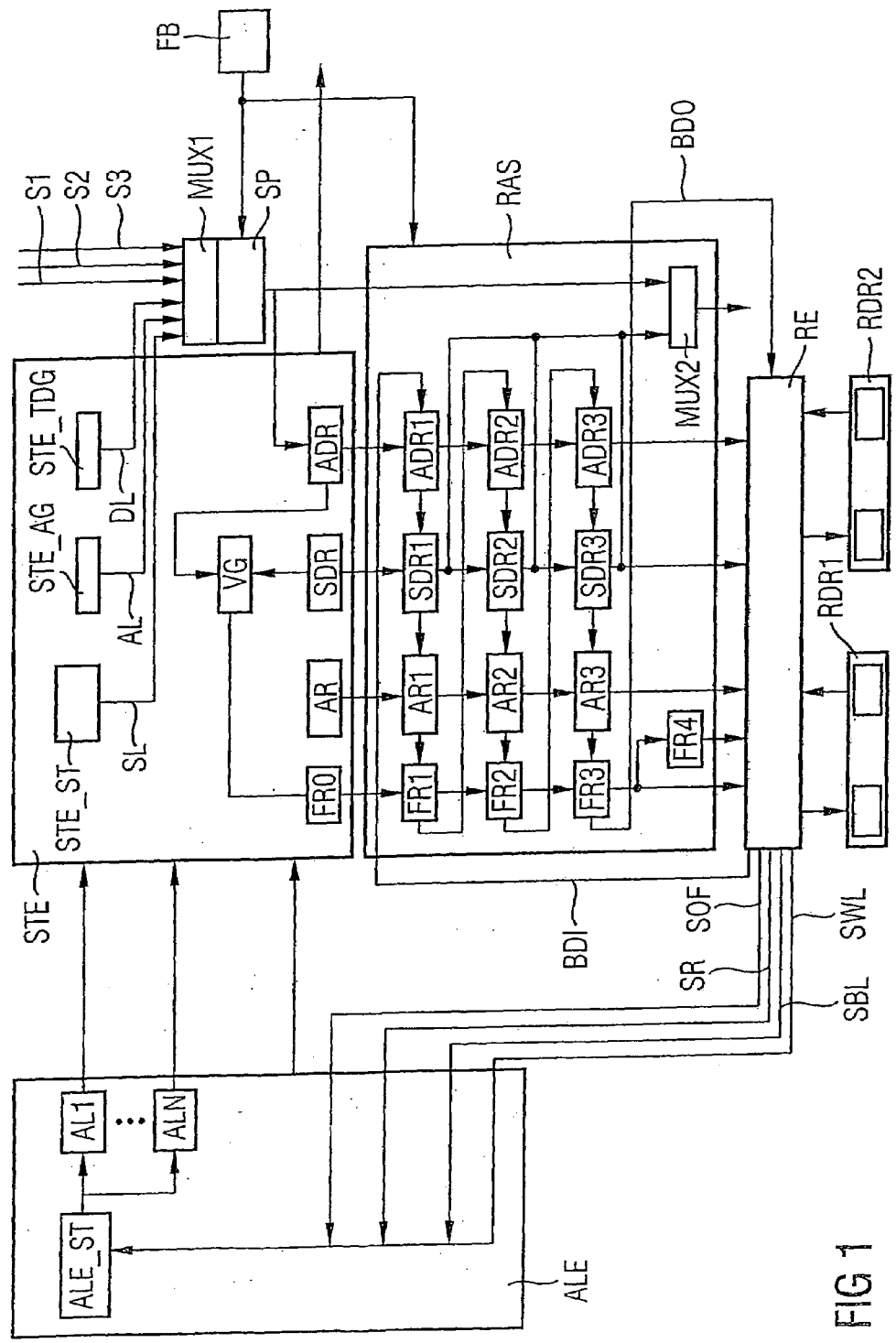
FIG. 1 shows a block diagram of an integrated memory according to the invention.

A block diagram of an integrated memory is shown in FIG. 1. The integrated memory has a main data memory SP, in which is arranged a memory cell array (not illustrated) with a plurality of memory cells, which are arranged in particular in matrix form. For testing purposes, the main data memory SP can be divided into a plurality of sub-areas (not illustrated) of identical size or of different size. The main data memory SP is connected to a first multiplexer MUX1, which has first inputs to which an external address signal S1, an external data signal S2 and an external control signal S3 can be applied. Furthermore, the integrated memory has a self-test unit STE embodied as an MBIST unit (Memory Built-In Self-Test unit). The self-test unit STE is connected to the main data memory SP and to a redundancy analysis memory RAS. Furthermore, the integrated memory comprises a computing unit RE connected to the redundancy analysis memory RAS and to an algorithm unit ALE. The algorithm unit ALE is furthermore electrically connected to the self-test unit STE. A read-only memory unit or fuse box unit FB is connected to the main data memory SP and the redundancy analysis memory RAS.

The self-test unit STE connected to the first multiplexer MUX1 and the main data memory SP comprises a control unit STE_ST, an address generator STE_AG and a test data generator STE_TDG. The control unit STE_ST is connected to the main data memory SP via a control line SL. The address generator STE_AG is connected to the main data memory SP via an address line AL and the test data generator STE_TDG is connected to the main data memory SP via a data line DL. The self-test unit STE furthermore has an address register AR and a first data register SDR. The desired output test data assigned to a specific address which is buffer-stored in the address register AR are buffer-stored in the first data register SDR. Furthermore, the self-test unit STE comprises a data comparison circuit VG, by means of which the desired output test data buffer-stored in the data register SDR are compared with the output test data read out from the main data memory SP, said output test data being buffer-stored in a second data register ADR. For this purpose, the data comparison circuit VG is connected by data lines to the first data register SDR and the second data register ADR. Said data comparison circuit VG is advantageously embodied as an EXOR circuit. The data comparison circuit VG has an output connected to an input of a flag bit register FR0. A deviation—identified by the data comparison circuit VG—between the output test data and the expected desired output test data, and hence a defective data memory unit, is indicated by means of the flag bit register FR0 and the flag bit stored therein. If such a deviation is detected by the data comparison circuit VG, and thus a defective data memory unit is detected within the main data memory SP, the address buffer-stored in the address register AR, of the data memory unit identified as defective, is stored via a further address line in a first redundancy address register AR1 of a redundancy address memory of the redundancy analysis memory RAS.

At the same time, the desired output test data held in the first data register SDR are stored in a first redundancy data memory register SDR1 of a first redundancy data memory of the redundancy analysis memory RAS. Concurrently, the output test data contained in the second data register ADR of the self-test unit STE are also stored in a first redundancy data memory register ADR1 of a second redundancy data memory of the redundancy analysis memory RAS. In the exemplary embodiment, the redundancy address memory of the redundancy analysis memory RAS comprises the redundancy address memory registers AR1, AR2 and AR3. The first redundancy data memory of the redundancy analysis memory RAS comprises the redundancy data memory registers SDR1, SDR2 and SDR3. Furthermore, the second redundancy data memory of the redundancy analysis memory RAS comprises the redundant data memory registers ADR1, ADR2 and ADR3. For each deviation between the desired output test data and the output test data that is identified by the data comparison circuit VG, the corresponding address, the assigned expected desired output test data and also the output test data are inserted and stored in parallel in the redundancy analysis memory RAS.

It may also be provided that the storage of the addresses of the defective data memory units detected and the storage of the desired output test data assigned to said address and of the output test data is stored in the redundancy analysis memory RAS not in parallel but rather serially clocked in blockwise fashion. In this case, the flag bit registers FR1, FR2 and FR3, the associated redundancy address memory registers AR1, AR2 and AR3, the assigned redundancy data memory registers SDR1, SDR2 and SDR3 of the first redundancy data memory and also the redundancy data memory registers ADR1, ADR2 and ADR3 of the second redundancy data memory are connected together to form a data block. This data block is additionally connected together with the respectively preceding and also the downstream data blocks of the flag bit registers, the redundancy address memory registers, and also the redundancy data memory registers of the first and second redundancy data memories.

Furthermore, the outputs of the redundancy data memory registers SDR1, SDR2 and SDR3 are connected to a first input of a second multiplexer MUX2. Furthermore, the registers arranged last in the respective register banks, in the exemplary embodiment the flag bit register FR3, the redundancy address memory register AR3, the redundancy data memory register SDR3 and the redundancy data memory register ADR3, are connected to the computing unit RE, in particular to the corresponding registers in the computing unit RE. Furthermore, the flag bit register FR3 is connected to an input of the flag bit register FR4. Said flag bit register FR4 is connected to an input of the computing unit RE. If the flag bit registers FR1 to FR3, the redundancy address memory registers AR1 to AR3, the redundancy data memory registers SDR1 to SDR3 of the first redundancy data memory and the redundancy data memory registers ADR1 to ADR3 of the second redundancy data memory of the redundancy analysis memory RAS are occupied, and if the flag bit set in the flag bit register FR3 is shifted out after the occurrence of a further detected deviation between expected desired output test data and output test data of the main data memory SP, then the flag bit stored in the flag bit register FR4 indicates to the computing unit RE that the storage capacity of the redundancy analysis memory RAS is exceeded and the information item stored in the redundancy analysis memory RAS are read out into the computing unit RE or possibly a repair of the main data memory SP is no longer possible.

Furthermore, the computing unit RE is connected to the redundancy analysis memory RAS, in particular to the redundancy data memory register ADR1, via the signal line BDI. For its part, the redundancy analysis memory RAS is electrically connected to the computing unit RE via the signal line BDO present at an output of the flag bit register FR3. In the computing unit, the signal line BDI is connected to a first input of a multiplexer (not illustrated). Furthermore, the signal line BDO is connected to the input of a data memory register (not illustrated) to which the output test data of the redundancy data memory register ADR3 are written. An output of a flag bit register (not illustrated) of the computing unit RE is connected to a second input of said multiplexer of the computing unit RE. The signal line BDI is present at the output of said multiplexer. This results in the formation of, as it were, a closed data circuit between the redundancy analysis memory RAS and the computing unit RE. Data and addresses can thus be shifted from the redundancy analysis memory RAS into the computing unit RE and back.

The second multiplexer MUX2 has a second input connected to the output of the main data memory SP. Depending on whether an address present on an address bus is stored in a redundancy address memory register after repair of the main data memory SP, or whether this applied address has been identified as correct in the main data memory SP in the test run, either the first input or the second input of the second multiplexer MUX2 is driven in order to switch through the data respectively assigned to said address via the multiplexer MUX2.

The computing unit RE uses the information items read out from the redundancy analysis memory RAS to determine a repair strategy for repairing the main data memory SP. The items of information concerning which redundant rows and/or redundant columns and/or redundant words contribute to an optimum repair strategy are programmed in the redundancy registers RDR1 and RDR2 connected to the computing unit RE. The computing unit RE is connected to the algorithm unit ALE via a plurality of signal lines. Via the signal line SWL, the algorithm unit ALE is communicated a signal that redundant columns are no longer available for a further repair of the main data memory SP or that the available redundant rows have been required completely in the previously determined intermediate repair strategy. Correspondingly, a signal is transferred to the algorithm unit ALE via the signal line SBL, which signal indicates that no further redundant columns are available for a repair. Via the signal line SR, the computing unit RE controls the algorithm unit ALE and also the self-test unit STE in such a way that a test run can be interrupted during the read-out of the information items from the redundancy analysis memory RAS and said test run can be continued again after the determination of a repair strategy by the computing unit RE. Furthermore, a signal is transferred to the algorithm unit ALE via the signal line SOF, which signal indicates that the storage capacity of the redundancy analysis memory RAS is occupied or the deviations between output test data of the main data memory SP and desired output test data that are detected by means of the data comparison circuit VG exceed the storage capacity of the redundancy analysis memory RAS. The signals of the signal lines SWL, SBL, SR and SOF are transferred to a control unit ALE_ST of the algorithm unit ALE. By means of this control unit ALE_ST, the different test algorithms AL1 to ALN can be activated and applied to the self-test unit STE.

A preferred exemplary embodiment of the method for testing an integrated memory according to the invention is explained with reference to a flow diagram in accordance with FIG. 2. After the method for testing the integrated memory according to the invention is started, the redundancy address registers AR1 to AR3 of the redundancy address memory of the redundancy analysis memory RAS are initialized or reset. The main data memory SP is subdivided into a plurality of sub-areas and one of these sub-areas is selected for testing. In method step S1, a data memory unit in the data memory array of this sub-area of the main data memory SP is addressed by an address generated in the address generator STE_AG of the self-test unit STE being applied to the main data memory SP via the address line AL. At the same time, input test data are generated in the test data generator STE_TDG of the self-test unit STE and are applied to the data memory unit selected for testing by means of the applied address. In a subsequent method step S2, output test data are read out from the addressed data memory unit of the main data memory SP and written to the second data register ADR of the self-test unit STE. These output test data are transferred from the second data register ADR to the data comparison circuit VG, which compares said output test data with expected desired output test data from the first data register SDR.

If the comparison in the data comparison circuit VG ascertains a deviation between the output test data and the expected desired output test data, the method changes over to step S3. In this step S3, firstly a check is made to establish whether the redundancy address memory of the redundancy analysis memory RAS still has free redundancy address registers AR1, AR2, AR3. If it is ascertained in this case that the redundancy address registers AR1 to AR3 are not yet completely occupied, in a subsequent method step S4 the applied address from the address register AR of the self-test unit STE is stored in the first redundancy address register AR1 in the redundancy analysis memory RAS. At the same time, the expected desired output test data from the data register SDR of the self-test unit STE are stored in the first redundancy data memory register SDR1 of the first redundancy data memory in the redundancy analysis memory RAS. Concurrently, the output test data buffer-stored in the second data register ADR are stored in the first redundancy data memory register ADR1 of the second redundancy data memory of the redundancy analysis memory RAS. In one example, the storage of the addresses and of the data assigned to this address in the registers AR1, SDR1 and ADR1 is affected in synchronously clocked fashion.

In the exemplary embodiment, the redundancy address memory comprising the registers AR1 to AR3, the first redundancy data memory comprising the registers SDR1 to SDR3, the second redundancy data memory comprising the registers ADR1 to ADR3, and also the flag bit registers FR1 to FR4 are advantageously embodied in such a way that information items already stored in the respective registers are advanced to the next register unit if a further address, a further flag bit, further output test data and further desired output test data from the self-test unit STE are stored in the redundancy analysis memory RAS. Preferably, in the exemplary embodiment, the storage of the addresses, of the output test data and of the desired output test data in the corresponding registers of the redundancy analysis memory RAS is affected in parallel. However, it may also be affected in a serial manner.

If the corresponding data (flag bit, address, output test data, desired output test data) from the self-test unit STE are stored in the redundancy analysis memory RAS, the test run is continued with the testing of a further address of the selected sub-area of the main data memory SP, in accordance with method step S5. Method steps S1 and S2 are repeated. If, for this further address, too, a deviation between the output test data and the expected desired output test data is detected in the data comparison circuit VG, steps S3 to S5 are carried out analogously as long as the address registers AR1 to AR3 have storage possibilities for a further address to be stored.

If, for said further tested address, a correspondence between the output test data and the expected desired output test data is detected in method step S2, the test method is continued with step S6. In this method step S6, a check is made to establish whether a first test run is completely ended, i.e. all addresses to be tested of the selected sub-area of the main data memory SP have been tested. If the first test run is not yet completely ended, in accordance with method step S5, a further data memory unit of the sub-area of the main data memory SP is addressed by application of the assigned address and tested by application of corresponding input test data.

If it is ascertained in method step S6 that the first test run and the testing of the first sub-area of the main data memory SP have been completely carried out, this first sub-area, if possible, is completely repaired. In this case, the repair strategy is formed exclusively by the memory registers SDR1 to SDR3 provided in the redundancy analysis memory RAS and the address memory registers AR1 to AR3. If the test method or the first test run is carried out with a clock frequency which can be set individually and which corresponds in particular to the maximum clock frequency of the integrated memory, then, in method step S7, firstly this individually set preferred maximum clock frequency is reduced. Afterwards, the information items contained in the occupied flag bit registers, the occupied redundancy address registers and the occupied redundancy data memory registers of the first and second redundancy data memories are read out and these addresses and data are programmed into the memory registers RDR1 and RDR2 connected to the computing unit RE.

The read-out of these information items from the redundancy analysis memory into the registers RDR1 and RDR2 can be accomplished by means of the computing unit RE. However, it can also be carried out in such a way that the transfer of these information items is carried out via a direct connection (not illustrated in FIG. 1) between the redundancy analysis memory and the registers RDR1 and RDR2. The registers of the redundancy analysis memory RAS are subsequently emptied. It may be provided that the first sub-area, which has now already been tested and completely repaired, is again tested using the same or a different test algorithm in order to identify defective data memory units possibly not detected during the first test run. A determination and calculation of the repair strategy in the computing unit RE is not necessary in this case, but may be provided.

In accordance with method step S8, a check is subsequently made to establish whether or not the test run of the entire main data memory SP is ended. If not all the sub-areas of the main data memory SP have been completely tested yet, in accordance with method step S9, the clock frequency for testing the integrated memory is increased again to the maximum clock frequency with which the integrated memory can be operated, and the procedure continues in accordance with method step S5. In step S5, firstly a further sub-area to be tested of the main data memory SP is selected.

If it is identified during a test run, in method step S3, that the storage capacity of the redundancy analysis memory RAS is completely occupied, and address and data of a further data memory unit identified as defective in method step S2 can no longer be written to the corresponding registers of the redundancy analysis memory RAS, a changeover is made from method step S3 to method step S10. In method step S10, the test run is firstly interrupted and said information items stored in the redundancy analysis memory RAS are read into the computing unit RE. Afterwards, in the computing unit RE, the exact defect positions are identified in the output test data by means of a bit-by-bit comparison of said output test data with the desired output test data. On the basis of said information items read out from the redundancy analysis memory RAS or the precisely known defect positions in the output test data, a repair strategy is determined in the computing unit RE. In this case, the repair strategy is carried out by means of available second redundant areas, embodied as redundant rows in the exemplary embodiment, and/or third redundant areas, embodied as redundant columns in the exemplary embodiment. Depending on how the defect positions are arranged in the output test data or on which memory cells have been identified as defective in that sub-area of the main data memory SP which is selected for testing, it is possible to design the repair strategy exclusively from redundant rows or exclusively from redundant columns. Depending on which redundancies are available for the repair, an optimum repair strategy may also be determined from a combination of redundant rows and redundant columns.

It should be noted here that redundant words, which represent the first redundant areas in the exemplary embodiment, redundant rows and redundant columns are not only to be understood as embodiments of redundancies which identify the respective maximum data width of said respective redundancies, but are also to be understood as any arbitrary other possible embodiment of a data width which may be available and selected from the respective interval for the data widths of the respective redundancy. By way of example, both a plurality of an entire redundant row and a redundant row divided into two halves and a redundant row subdivided into individual bit positions are generally designated as redundant row. Logically, the two halves or the individual bit positions must be addressed in each case. The designation of a redundant row, which designation is used here as a superordinate term, thus encompasses all possible data widths prescribed by the interval for the data widths. A redundant row may thus have a diversely embodied data width, depending on the respective defect positions, in order thus to be able to enable an optimum intermediate repair strategy. Equally, the term redundant rows is also to be understood to include a plurality of rows, as may be realized for example in a sub-area of the main data memory SP. The designations redundant columns and redundant words are to be understood analogously.

It may be provided that addresses and data read out from the registers of the redundant analysis memory RAS and transferred to the computing unit RE are written back to the redundancy analysis memory RAS again if no suitable redundancy—rows, columns—is present in order to enable optimum elimination of the defective data memory unit.

Afterwards, these redundancies used for the intermediate repair strategy are activated and the first test run, if the latter was interrupted before the read-out of the information items from the redundancy analysis memory RAS, is continued. The clock frequency for further testing, which was reduced before the read-out of the information items from the redundancy analysis memory RAS, is then increased again to the critical clock frequency of the integrated memory (step S9). It may also be provided here that before the continuation of the first test run, in the computing unit RE, a check is made to establish whether all defective memory cells were able to be repaired by means of the intermediate repair strategy determined. After the continuation of the first test run, the method is continued with the method steps already described until either the first test run is completely ended and the redundancy analysis memory RAS is at most completely filled with further information items of defective memory cells or data memory units, or until the redundancy analysis memory RAS is completely filled with information items of defective data memory units before the ending of the first test run and the address and also the output test data and the desired output test data of a further data memory unit identified as defective can no longer be stored in the corresponding registers of the redundancy analysis memory RAS.

In the first case, that is to say if the test is completely ended (this is identified in step S6) and the registers of the redundancy analysis memory RAS are at most completely occupied, in accordance with step S10, the procedure again continues firstly with the read-out of the further information items stored in the redundancy analysis memory RAS. After the identification of the exact defect positions in the output test data, the repair strategy is determined taking account of the previously determined intermediate repair strategy and possibly redundant words and/or redundant rows possibly still present and/or redundant columns possibly still present. If redundant words are also used for the repair of the main data memory SP, they are written to the redundancy analysis memory RAS in a subsequent step. Afterwards, the redundant words and/or possibly redundant rows and/or possibly redundant columns that are possibly determined in addition to the already activated redundancies of the intermediate repair strategy are activated. Furthermore, a check is then made to establish whether the defective main data memory SP was able to be successfully repaired by means of the redundancies or whether successful repair has not been effective and the main data memory SP is characterized as not repairable by means of a defect signal.

However, it may also be provided that in this case explained above in which a test run is ended and the redundancy analysis memory RAS, after it has been read at least once (overfilled at least once) during the test run, is now at most maximally occupied when the test run is ended, the repair strategy for the defect information items still written in the redundancy analysis memory RAS is only repaired by means of the first redundant areas present in the redundancy analysis memory RAS. A read-out of these defects detected last (the number may maximally correspond to the maximum storage capacity of the redundancy analysis memory RAS) into the computing unit RE is no longer necessary in the case of this alternative.

In the other case, in which the registers of the redundancy analysis memory RAS are full at least a second time, data of a further data memory unit identified as defective can no longer be stored in the registers of the redundancy analysis memory RAS and the first test run is not yet completely ended, the procedure follows the explanations mentioned above and an attempt is made to generate a suitable and optimum intermediate repair strategy by means of redundant rows and/or redundant columns possibly still present. This determination of the intermediate repair strategy is terminated or the integrated memory is identified as defective and non-repairable only when all available redundant rows and/or redundant columns have already been used for the repair strategy, and, in addition, a number of defective data memory units which exceeds the storage capacity of the registers of the redundancy analysis memory RAS is again detected. In this case, the defective data memory units detected can no longer be repaired by means of the redundant words in the redundancy analysis memory RAS since the number of defective data memory units exceeds the number of redundant words provided by the redundancy analysis memory RAS.

However, if it is identified in step S10 that not all the redundant rows and/or redundant columns were required for the repair during the determination of the preceding intermediate repair strategy, it is possible to determine a further intermediate repair strategy by means of the redundant rows still present and/or redundant columns still present. In this case, if necessary, the preceding intermediate repair strategy may be altered or completely revised in order to be able to optimally determine the intermediate repair strategy that is currently to be determined. Depending on how many further defective data memory units are detected during the continued test run, the previously explained checks of still available redundancies and determinations of intermediate repair strategies are repeated or a defect signal is generated in the event of identification of an integrated memory that is no longer repairable.

The checking of redundant rows and/or columns that are still present and may have not been required during the determination of a preceding intermediate repair strategy can also be carried out when the test run is ended after the determination of one or more intermediate repair strategies and an entire repair strategy is determined virtually by means of the intermediate repair strategies and the redundant rows that are possibly still present and can be provided and/or possibly the redundant columns and words that are still present and can be provided. The first redundant areas (redundant words of the redundancy analysis memory) are thus provided in this case for the determination of a final or concluding repair strategy if the test run is ended, and the number of defective data memory units detected after the determination of one or more intermediate repair strategies does not exceed the maximum storage capacity of the redundancy analysis memory RAS.

If a complete repair of the integrated memory is possible by means of the entire repair strategy determined, the addresses and data of the activated possibly redundant rows and/or possibly redundant columns and/or redundant words are programmed into a non-volatile memory FB (FIG. 1) connected to the main data memory SP and the redundancy analysis memory RAS. It may also be provided that this read-only memory FB can be reprogrammed. This affords the possibility of searching for and detecting further defects with respect to already known defects.

The alteration or revision of already existing intermediate repair strategies can be carried out in all test phases of the determination of further intermediate repair strategies or concluding repair strategies.

Provision may also be made in all test phases for repairing redundancies—first, second and third redundant areas—which have already been activated and are required and selected for an intermediate repair strategy or a concluding repair strategy and prove to be defective in the further test run by means of first and/or second and/or third redundant areas possibly still present and/or further redundant areas.

By means of the method according to the invention and the integrated memory according to the invention, the defective data memory units or memory cells of a main data memory SP can be detected rapidly and reliably and the storage and use of large and storage-capacity-intensive bitmaps can furthermore be prevented. In particular, this is ensured by virtue of the fact that the redundancy analysis memory is used in the first place as a memory unit for the addresses and data of defective data memory units, and is used in the second place as a redundancy data memory which provides redundant words for the repair of the integrated memory or the main data memory SP. A repair strategy can thus be carried out possibly by means of redundant rows, redundant columns and redundant words, thus resulting in a significant improvement in the probability of being able to repair a defective main data memory SP. The redundancy analysis memory RAS can be used, for all the sub-areas of the main data memory SP that is subdivided for testing purposes, as a buffer memory for defect information items and as a redundancy data memory whose registers can be read and emptied in order to be able to write further defect information items. The redundant areas of the redundancy analysis memory RAS which are possibly used for the repair can be programmed into memory registers RDR1 and RDR2 depending on the already completed test of the main data memory SP. Furthermore, by means of the method according to the invention and the integrated memory according to the invention, on-chip testing is possible and the test run can be carried out with the maximum clock frequency of the integrated memory.

It may also be provided that the computing unit RE is always activated during the test run or is activated only when the redundancy analysis memory RAS is filled and can no longer store further data and addresses of defective data memory units. By means of the method according to the invention, it is also possible to test integrated memories or main data memories SP that have only redundant rows or only redundant columns in addition to the redundant words provided in the redundancy analysis memory, for a possible repair.

If an interruption of the test run is carried out during a test run, then after the test run is continued again, it is possible to continue testing with a test algorithm that is identical to or different from the test algorithm selected for testing purposes before the interruption of the test run. The selection of the test algorithm is controlled by means of the computing unit RE and the selection of a corresponding test algorithm AL1 to ALN is carried out by means of the control unit ALE_ST of the algorithm unit ALE. Test algorithms that are short are particularly advantageous in this case since the time of a test run can thereby be reduced. Selection of different test algorithms makes it possible to improve the finding of row defects or column defects.

In order to be able to detect specifically bit-oriented or word-oriented defects, provision may be made for using test algorithms with which these specific defects may in each case be detected particularly well.

The main data memory SP may be embodied as a volatile or as a non-volatile data memory.

It may be provided that the computing unit RE in the proposed integrated memory according to the invention is operated in a plurality of operating modes. In a first operating mode during a test phase, provision may merely be made for starting a self-test in which, however, no repair is carried out. A diagnosis, i.e. a comparison between output test data and expected desired output test data, may optionally be carried out in this first operating mode. In a second operating mode during a test phase, the self-test unit STE is only used for the analysis of redundant words. In this second operating mode, the redundancy analysis memory RAS may be used only for the activation of redundant words and for the analysis of a repair. In a third operating mode during the test phase, which is referred to below as redundancy activation mode, the computing unit RE is operated in such a way that a repair strategy is determined on the basis of redundant rows and/or redundant words and/or redundant columns and, moreover, different test algorithms can be selected for an optimum detection of defective data memory units and an optimum determination of a repair strategy. This redundancy activation mode is that operating mode of the computing unit RE on which the explanations concerning FIGS. 1 and 2 are based. It may also be provided that the test run continues to run, and is not interrupted, even during the read-out of the information items from the redundancy analysis memory RAS and the subsequent method sequences in the computing unit RE.

It may also be provided that the redundancy analysis memory RAS is constructed in such a way that desired output test data and output test data are not stored in two separate words, rather the bit errors are stored directly by means of a comparison. As a result, during a test run, the algorithm would recognize that the address has already been identified with defects. If data memory units other than in the first comparison are defective, then they could thus be added to the word with the bit errors in the redundancy analysis memory RAS. One advantage that results from this is a reduced area requirement.

Depending on how the defect positions are arranged in the output test data or on which memory cells in that sub-area of the main data memory SP which is selected for testing purposes have been identified as defective, it is thus possible to design the repair strategy exclusively from redundant rows or exclusively from redundant columns or exclusively from redundant words. Depending on which redundancies are available for the repair, an optimum repair strategy may also be determined from a combination of redundant rows and redundant columns or from a combination of redundant rows and redundant words, or a combination of redundant columns and redundant words, or else from a combination of redundant rows and redundant columns and redundant words.

Figure 2:
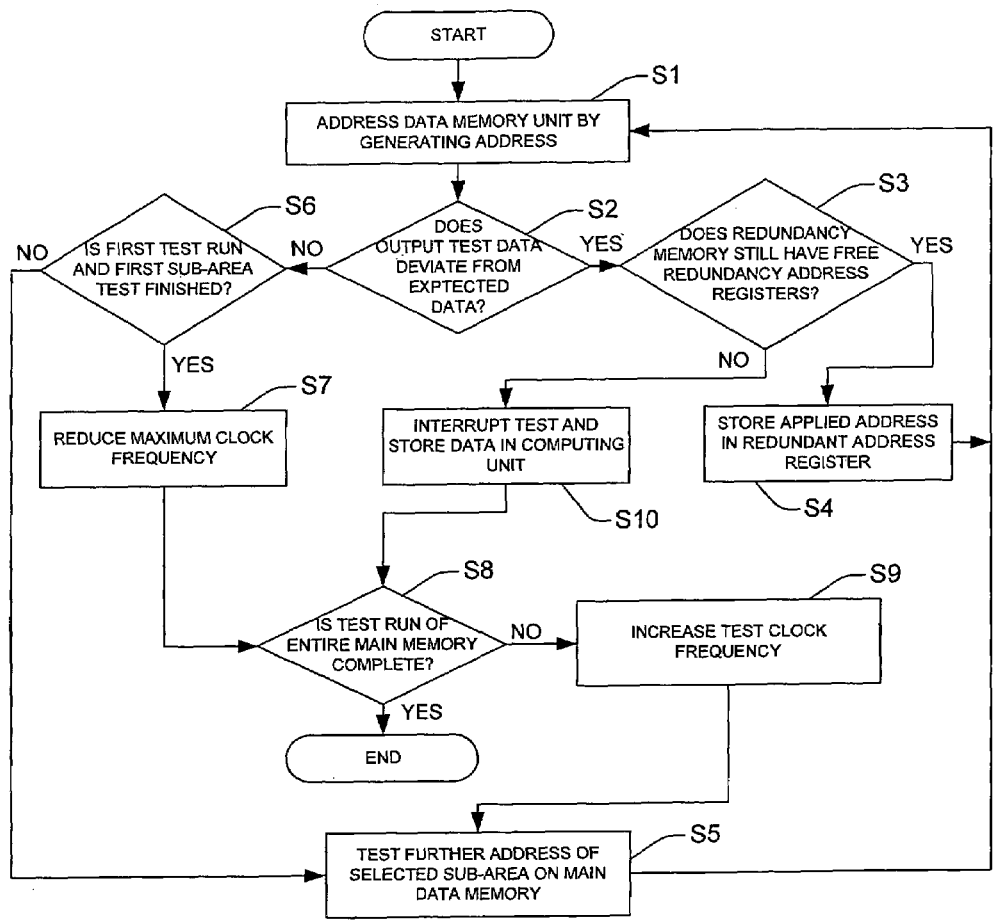
FIG. 2 shows a flow diagram of a method sequence according to the invention.

The invention is not restricted to the exemplary embodiments illustrated in FIGS. 1 and 2, but rather can be modified or supplemented in diverse ways encompassed by the claims.

Although the invention has been illustrated and described with respect to one or more implementations, alterations and/or modifications may be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A method for testing an integrated memory having a main data memory with a plurality of data memory units, comprising:
   a) addressing a data memory unit by applying an address of the data memory unit to an address bus operably coupled to the main data memory;
   b) applying input test data to a data bus operably coupled to the main data memory to test the addressed data memory unit;
   c) reading out output test data from the addressed data memory unit;
   d) comparing the output test data with expected desired output test data;
   e) storing the applied address, the expected desired output test data, and the output test data as information in a redundancy analysis memory if a deviation of the output test data from the desired output test data occurs;
   f) providing first redundant areas in the redundancy analysis memory and providing at least second redundant areas outside the redundancy analysis memory; and
   g) determining a repair strategy by means of the first and second redundant areas on the basis of the information stored in the redundancy analysis memory,
      wherein determining the repair strategy in accordance with step g) further comprises the following if the storage capacity of the redundancy analysis memory is exceeded by the number of defective data memory units detected, that are stored in the redundancy analysis memory, and a first test run is not yet concluded:
   h) reading out of the information items stored in the redundancy analysis memory into a computing unit;
   i) determining an intermediate repair strategy in the computing unit by means of the at least second redundant areas;
   j) continuing the first test run if the first test run is interrupted before step h); and
   k) repeating steps a) to j).

2. The method of claim 1, further comprising dividing the main data memory, for testing purposes, into sub-areas that are tested separately.

3. The method of claim 2, wherein dividing the main data memory comprises dividing the main data memory into sub-areas of identical size or of different size, and determining a repair strategy for each sub-area, the testing of the entire main data memory being carried out in an iterative manner by the sub-areas being tested one after the other.

4. The method of claim 2, wherein the first redundant areas of the redundancy analysis memory is provided for repairing each sub-area and the at least second redundant areas are provided for only one sub-area in each case.

5. The method of claim 1, wherein at least one first sub-area of the main data memory is provided as a redundant area.

6. The method of claim 5, wherein the first sub-area is firstly tested and, after successful conclusion of the testing of the first sub-area, transferring useful information items of a sub-area that is to be tested as a further sub-area to the first sub-area.

7. The method of claim 1, further comprising employing the first redundant areas, depending on the number of detected deviations of the output test data from the expected desired output test data before the at least second redundant areas of the integrated memory for the determination of the repair strategy.

8. The method of claim 7, further comprising exclusively employing first redundant areas of the redundancy analysis memory for the repair strategy if a test run is ended and a storage capacity of the redundancy analysis memory is occupied at most maximally with information items of the defective data memory units detected.

9. The method of claim 1, further comprising repeating step k) until identifying that the integrated memory is no longer repairable during or after the carrying out one of steps a) to j), or completing the test run and the storage capacity of the redundancy analysis memory after completion of the test run is occupied at most maximally with information items of further defective data memory units detected.

10. The method of claim 9, further comprising, after completing the test run, determining a final repair strategy using previously determined intermediate repair strategies and first redundant areas and/or at least second redundant areas.

11. The method of claim 9, further comprising altering the previously determined intermediate repair strategies during a determination of a further intermediate repair strategy or of a final repair strategy.

12. The method of claim 1, wherein the information items stored in the redundancy analysis memory are read out progressively or completely and transferred into the computing unit, and written from the computing unit to the redundancy analysis memory again during the determination of an intermediate repair strategy.

13. The method of claim 1, wherein, before the execution of step i), identifying an exact defect position in the output test data by comparing the output test data with the desired output test data in the computing unit on a bit-by-bit basis.

14. The method of claim 1, wherein the information items as to which first redundant areas and/or which second redundant areas and/or are utilized for an intermediate repair strategy or a concluding repair strategy, and the information therein are written to memory registers operably coupled to the computing unit.

15. The method of claim 1, further comprising executing a plurality of test runs with identical or different test algorithms or, after an interruption of a single test run, a test algorithm for testing is chosen that is identical to or different from the test algorithm with which the testing is carried out before the interruption of the single test run.

16. The method of claim 15, wherein different test algorithms are used for identifying differently categorized defects such as bit-oriented defects and word-oriented defects.

17. The method of claim 1, wherein a first test run is executed with a maximum clock frequency of the integrated memory.

18. The method of claim 1, wherein during the reading out of the information items stored in the redundancy analysis memory, the clock frequency with which the integrated memory is tested is reduced.

19. The method of claim 1,
wherein a data width of a first redundant area comprises an interval which extends from a single bit up to a number of bits forming an entire word; and
wherein a data width of a second redundant area comprises an interval that extends from a single bit up to a number of bits forming an entire row or a plurality of rows, or an entire column or a plurality of entire columns.

20. The method of claim 1, further comprising executing the repair strategy and after the repair of the integrated memory, writing the information items of the activated first redundant areas and/or the second redundant areas to a non-volatile, programmable memory.

21. The method of claim 1, further comprising identifying defects in the second redundant areas that are used for an intermediate repair strategy, and replacing the second redundant areas with other second redundant areas and/or first redundant areas.

22. The method of claim 1, further comprising combining the method with test methods that use error-detecting and error-correcting codes.

* * * * *